US006512688B2

(12) United States Patent
Thewes et al.

(10) Patent No.: US 6,512,688 B2
(45) Date of Patent: Jan. 28, 2003

(54) DEVICE FOR EVALUATING CELL RESISTANCES IN A MAGNETORESISTIVE MEMORY

(75) Inventors: Roland Thewes, Gröbenzell (DE); Werner Weber, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/968,287

(22) Filed: Oct. 1, 2001

(65) Prior Publication Data

US 2002/0093848 A1 Jul. 18, 2002

Related U.S. Application Data

(63) Continuation of application No. PCT/DE00/00778, filed on Mar. 13, 2000.

(30) Foreign Application Priority Data

Mar. 30, 1999 (DE) .......................................... 199 14 488

(51) Int. Cl.[7] .............................................. G11C 11/00
(52) U.S. Cl. ...................................... 365/158; 365/148
(58) Field of Search ................................. 365/158, 148

(56) References Cited

U.S. PATENT DOCUMENTS 5,493,533 A  2/1996  Lambrache ................. 365/210
5,654,566 A  8/1997  Johnson ...................... 257/295
6,021,065 A * 2/2000  Daughton et al. .......... 365/158

OTHER PUBLICATIONS

International Search Report for PCT/DE00/00778, issued by the European Patent Office on Jul. 24, 2000.

* cited by examiner

*Primary Examiner*—M. Tran
(74) *Attorney, Agent, or Firm*—Laurence A. Greenberg; Werner H. Stemer; Gregory L. Mayback

(57) ABSTRACT

A magneto resistive memory contains first switches, a word line voltage source generating a word line voltage connected to the first switches, a line node, second switches, and cells formed of cell resistors each having a first terminal connected to the word line voltage through one of the first switches and a second terminal connected to the line node through one of the second switches. A reference resistor is connected to the line node and a reference voltage source is connected to the reference resistor. The reference resistor with the reference voltage source brings about a reduction in a respective cell current, flowing from the line node, by an average current. A device is connected to the line node and evaluates the cell resistors. The device has an amplifier for converting a difference between the respective cell current and the average current into a voltage functioning as an evaluation signal.

6 Claims, 1 Drawing Sheet

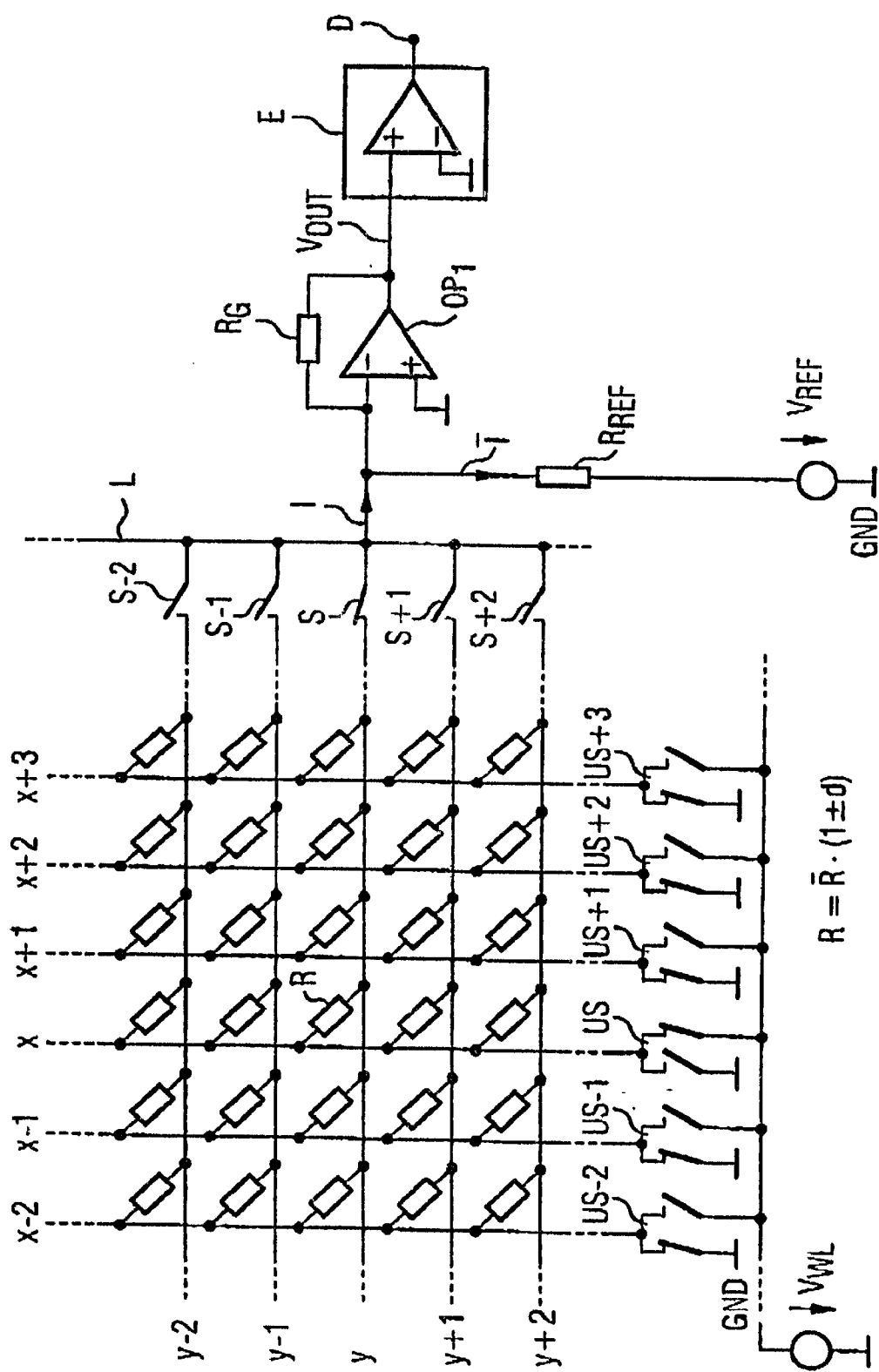

DEVICE FOR EVALUATING CELL RESISTANCES IN A MAGNETORESISTIVE MEMORY

CROSS-REFERENCE TO RELATED APPLICATION

This application is a continuation of copending International Application No. PCT/DE00/00778, filed Mar. 13, 2000, which designated the United States.

BACKGROUND OF THE INVENTION

Field of the Invention

The invention relates to a device for evaluating a magnetically variable electrical resistance of a magneto resistive memory cell (MRAM) with the aid of a reference resistance. Such a memory cell typically has a soft-magnetic layer and a hard-magnetic layer, which are electrically conductive and isolated from one another by a tunnel oxide, the tunneling probability and thus the electrical resistance depends on the directions of polarization of the two layers.

Such a device is disclosed in U.S. Pat. No. 5,173,873, in particular in FIG. 4, for each column the resistance of a single reference cell is used for evaluating a memory cell and an evaluation takes place rapidly and with a low power loss as a result.

On account of the fabrication tolerances, the cell resistances are not constant over the entire memory cell array and different output voltages occur for the same information state after the performance of a resistance/voltage conversion by an evaluation circuit, which output voltages can often no longer be correctly assigned by a decision circuit connected downstream.

SUMMARY OF THE INVENTION

It is accordingly an object of the invention to provide a device for evaluating cell resistances in a magneto resistive memory that overcomes the above-mentioned disadvantages of the prior art device of this general type, in which high offset voltages, which are critical in particular for new components with low voltage levels and a low power loss, are eliminated in the evaluation device.

With the foregoing and other objects in view there is provided, in accordance with the invention, a magneto resistive memory. The memory contains first switches, a word line voltage source generating a word line voltage connected to the first switches, a line node, second switches, and cells formed of cell resistors each having a first terminal connected to the word line voltage through one of the first switches and a second terminal connected to the line node through one of the second switches. A reference resistor is connected to the line node and a reference voltage source is connected to the reference resistor. The reference resistor with the reference voltage source brings about a reduction in a respective cell current, flowing from the line node, by an average current. A device is connected to the line node and evaluates the cell resistors. The device has an amplifier for converting a difference between the respective cell current and the average current into a voltage functioning as an evaluation signal.

In accordance with an added feature of the invention, the reference resistor is formed from an interconnection of the cell resistors of the cells containing different information contents.

In accordance with another feature of the invention, the reference resistor is formed from a single series circuit containing two of the cell resistors of the cells each having a different information content. Alternatively, the reference resistor is formed from a parallel circuit of series circuits each containing two of the cell resistors of the cells each having a different information content.

In accordance with a further feature of the invention, the reference voltage source outputs a reference voltage formed from the word line voltage with an aid of an inverting voltage amplifier circuit.

In accordance with a concomitant feature of the invention, the reference voltage source outputs a reference voltage, and the word line voltage is formed from the reference voltage with an aid of an inverting voltage amplifier circuit.

Other features which are considered as characteristic for the invention are set forth in the appended claims.

Although the invention is illustrated and described herein as embodied in a device for evaluating the cell resistances in a magneto resistive memory, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

The single FIGURE of the drawing is a circuit diagram of a memory configuration.

DESCRIPTION OF THE PREFERRED EMBODIMENTS

The invention is base on the concept that a cell current which is dependent on a respective information state of the cell is reduced by an average cell current and a current difference is converted into a corresponding output voltage. A combination of cell resistors from cells having different information contents is used to form an average cell current.

Referring now to the single FIGURE of the drawing, there is shown a preferred exemplary embodiment of the invention. The FIGURE shows a matrix-type configuration of bit lines y+2 ... y ... y−2 and word lines x−2 ... x ... x+3, which represents a detail from a cell array of a magneto resistive memory. A magneto resistive resistor R is present between each bit line and each word line, which resistor R usually is formed of a soft-magnetic region and a hard-magnetic region which lie one above the other and are isolated by a tunnel oxide. The selected cell resistor R is connected between a selected word line x and a selected bit line y. The selection or the addressing of the word lines is in this case effected with the aid of changeover switches US−2 ... US+3, which are each connected to one of the word lines x−2 ... x+3 and via which in each case one selected word line, here the word line x, is connected to a word line voltage $V_{WL}$ and the other word lines are connected to a reference-ground potential GND. To ensure that not all of the cell resistors R connected to the word line x but rather only the cell resistor R connected to the addressed bit line y is connected through to a common line L, all the switches S−2 ... S+2 except for the switch S remain open.

An evaluation circuit with a decision stage E connected downstream, which generates corresponding data levels D from an output voltage $V_{OUT}$ of the evaluation circuit, is present for a cell array region containing a plurality of bit lines and word lines or, alternatively, for the entire cell array.

The actual evaluation circuit has an operational amplifier $OP_1$, whose output carries the output voltage $V_{OUT}$ and is fed back via a feedback resistor $R_G$ to the inverting input and whose non-inverting input is connected to reference-ground potential. The inverting input of the operational amplifier $OP_1$ is connected to the collective line L, as a result of which, in this example, the word line voltage $V_{WL}$ is connected to the inverting input via the changeover switch US, the selected cell resistor R and the closed switch S and a corresponding cell current I flows from the line L. The cell resistance R is dependent on the stored information and can be specified as follows.

$$R=\bar{R}*(1\pm d),$$

where $\bar{R}$ denotes an average resistance and d denotes an information-dependent relative change in resistance which, for example, is of the order of magnitude of a few percent. In the case of the invention, an average current $\bar{I}$ is subtracted from the current I and only a current difference $I-\bar{I}$ passes to the inverting input of the operational amplifier $OP_1$ having feedback via the resistor $R_G$. The average current $\bar{I}$ is formed from a reference resistance $R_{REF}$ and a reference voltage $V_{REF}$, the reference voltage $V_{REF}$ having a different sign from the word line voltage $V_{WL}$. The reference resistance $R_{REF}$ and the reference voltage $V_{REF}$ must be dimensioned such that, for a cell resistance $R=\bar{R}$ and the word line voltage $V_{WL}$, the current I is equal to $\bar{I}$ and the output voltage $V_{OUT}$ is thus equal to zero.

In this case, the reference voltage $V_{REF}$ can advantageously be generated with the aid of a customary inverting operational amplifier circuit in a manner dependent on the word line voltage $V_{WL}$ but, conversely, the word line voltage $V_{WL}$ can also be generated in this way from a predetermined reference voltage $V_{REF}$.

The reference resistor $R_{REF}$ should advantageously be composed of the same material as the cell resistors R. Given the same geometry of the reference resistor $R_{REF}$ as the cell resistors, only resistances $R=\bar{R}*(1+d)$ are available, and not the average value $\bar{R}$. For this purpose, in the simplest case, a cell resistor of a cell with a stored logic one and a cell resistor of a cell with a stored logic zero are connected in series which supplies a reference resistor having the value 2 * $\bar{R}$ and requires a corresponding reference voltage $V_{REF}$. By connecting two such series circuits in parallel, it is possible to generate the reference resistance $R_{REF}=\bar{R}$ in a simple manner. In order to achieve an average value which is optimal for as many cells as possible, further such series circuits may be connected in parallel, thereby reducing the reference resistance and, correspondingly, also the requisite reference voltage.

We claim:

1. A magneto resistive memory, comprising:

first switches;

a word line voltage source generating a word line voltage connected to said first switches;

a line node;

second switches;

cells formed of cell resistors each having a first terminal connected to the word line voltage through one of said first switches and a second terminal connected to said line node through one of said second switches;

a reference resistor connected to said line node;

a reference voltage source connected to said reference resistor, said reference resistor with said reference voltage source bringing about a reduction in a respective cell current, flowing from said line node, by an average current determined by a reference resistance of said reference resistor and a reference voltage of said reference voltage source; and a device connected to said line node and evaluating said cell resistors, said device having an amplifier for converting a difference between the respective cell current and the average current into a voltage functioning as an evaluation signal.

2. The memory according to claim 1, wherein the reference resistance of said reference resistor is formed from an interconnection of resistances of said cell resistors of said cells containing different information contents.

3. The memory according to claim 2, wherein said reference resistor is formed from a single series circuit containing two of said cell resistors of said cells each having a different information content.

4. The memory according to claim 2, wherein said reference resistor is formed from a parallel circuit of series circuits each containing two of said cell resistors of said cells each having a different information content.

5. The memory according to claim 1, wherein said reference voltage source outputs a reference voltage formed from the word line voltage with an aid of an inverting voltage amplifier circuit.

6. The memory according to claim 1, wherein said reference voltage source outputs a reference voltage, and the word line voltage is formed from the reference voltage with an aid of an inverting voltage amplifier circuit.

* * * * *